(12) United States Patent  
Ivanov

(10) Patent No.: US 7,449,950 B2  
(45) Date of Patent: Nov. 11, 2008

(54) ANALOG SIGNAL PROCESSING CIRCUIT

(75) Inventor: Mikhail Ivanov, Erlangen (DE)

(73) Assignee: Texas Instruments Deutschland GmbH, Freising (DE)

( * ) Notice: Subject to any disclaimer, the term of this patent is extended or adjusted under 35 U.S.C. 154(b) by 72 days.

(21) Appl. No.: 11/554,270

(22) Filed: Oct. 30, 2006

(65) Prior Publication Data

US 2007/0115059 A1    May 24, 2007

(30) Foreign Application Priority Data

Oct. 28, 2005    (DE) ........................ 10 2005 051 778

(51) Int. Cl.
*H03F 3/45* (2006.01)
(52) U.S. Cl. ........................ 330/253; 330/255; 330/258
(58) Field of Classification Search ............. 330/9, 330/253, 255, 258, 263, 264, 252
See application file for complete search history.

(56) References Cited

U.S. PATENT DOCUMENTS 6,624,698 B2 *    9/2003    Nagaraj ...................... 330/258

7,276,962 B1 *    10/2007    Tomasi ........................ 330/9

* cited by examiner

*Primary Examiner*—Khanh V Nguyen
(74) *Attorney, Agent, or Firm*—Warren L. Franz; Wade J. Brady, III; Frederick J. Telecky, Jr.

(57) ABSTRACT

An analog signal processing block with differential signal inputs and including a differential amplifier with differential inputs is disclosed which is configurable to operate either in a differential output mode or in a single-ended output mode without affecting the desired frequency and time characteristics as determined by the switched capacitor networks. The analog signal processing block includes a pair of switched capacitor networks each having one of the differential signal inputs, an input-sided terminal connected to one of the differential inputs of the differential amplifier and an output-sided terminal. The output-sided terminal of a first one of the switched capacitor networks is connected to an output of the differential amplifier. The output-sided terminal of a second one of the switched capacitor networks is connected to a complementary output of the differential amplifier when configured to differential output mode, and connected to a reference potential when configured to the single-ended mode. In this way, an application can use an analog signal processing block in either of the fully differential and single-ended output modes without the need to reconfigure the switched capacitor networks for a desired frequency and time response characteristic.

7 Claims, 3 Drawing Sheets

US 7,449,950 B2

ANALOG SIGNAL PROCESSING CIRCUIT

The invention relates to an analog signal processing circuit block that can be used for filtering of analog signals.

BACKGROUND signal processing of analog signals often requires filtering, including integration, differentiation and amplification. A common method to implement filtering of analog signals with integrated circuits is the use of switched capacitor techniques, especially including correlated double sampling to cancel non-ideal circuit parameters. In such analog signal processing circuit blocks, the frequency and time response characteristics are determined by switched capacitor networks. According to the particular application, a fully differential output or a single-ended output of the processing circuit block is required.

SUMMARY

The invention provides an analog signal processing circuit block with differential signal inputs and including a differential amplifier with differential inputs and configurable to operate either in a differential output mode or in a single-ended output mode without affecting the desired frequency and time characteristics as determined by the switched capacitor networks. Specifically, the inventive analog signal processing circuit block includes a pair of switched capacitor networks each having one of the differential signal inputs, an input-sided terminal connected to one of the differential inputs of the differential amplifier and an output-sided terminal. The output-sided terminal of a first one of the switched capacitor networks is connected to an output of the differential amplifier. The output-sided terminal of a second one of the switched capacitor networks is connected to a complementary output of the differential amplifier when configured to differential output mode, and connected to a reference potential when configured to the single-ended mode. In this way, an application can use an analog signal processing block in either of the fully differential and single-ended output modes without the need to reconfigure the switched capacitor networks for a desired frequency and time response characteristic.

In a preferred embodiment, the differential amplifier has two output stages and one of the output stages is disabled in the single-ended output mode. Where the output stages each have complementary MOSFET driver transistors, this is simply achieved by disconnecting the gates of the driver transistors and connecting them to their sources.

In a preferred implementation, the differential amplifier includes an input pair of transistors that have their drains connected to a folded cascode structure with a class AB control block included in each branch of the folded cascode structure, The class AB control block on the side of the output stage which is disabled in the single-ended output mode, is also disabled (i.e. effectively shorted) in the single-ended output mode.

The analog signal processing block of the invention preferably has common mode feedback circuitry for use in the fully differential output mode of the differential amplifier. In the single-ended output mode, there is no need for the common made feedback circuitry, and the common mode feedback circuitry is disconnected in the single-ended output mode.

Still further, in the preferred embodiment, the differential amplifier is configured by application, to the analog signal processing block, of a digital control signal that controls a set of configuration switches associated with the differential amplifier. Accordingly, to select between the fully differential and single-ended output modes, all that a particular application must provide is a digital configuration control signal.

BRIEF DESCRIPTION OF THE DRAWINGS

Further details of the invention will become apparent from the following description with reference to the appending drawings, wherein.

DETAILED DESCRIPTION OF EMBODIMENTS

Figure 1:
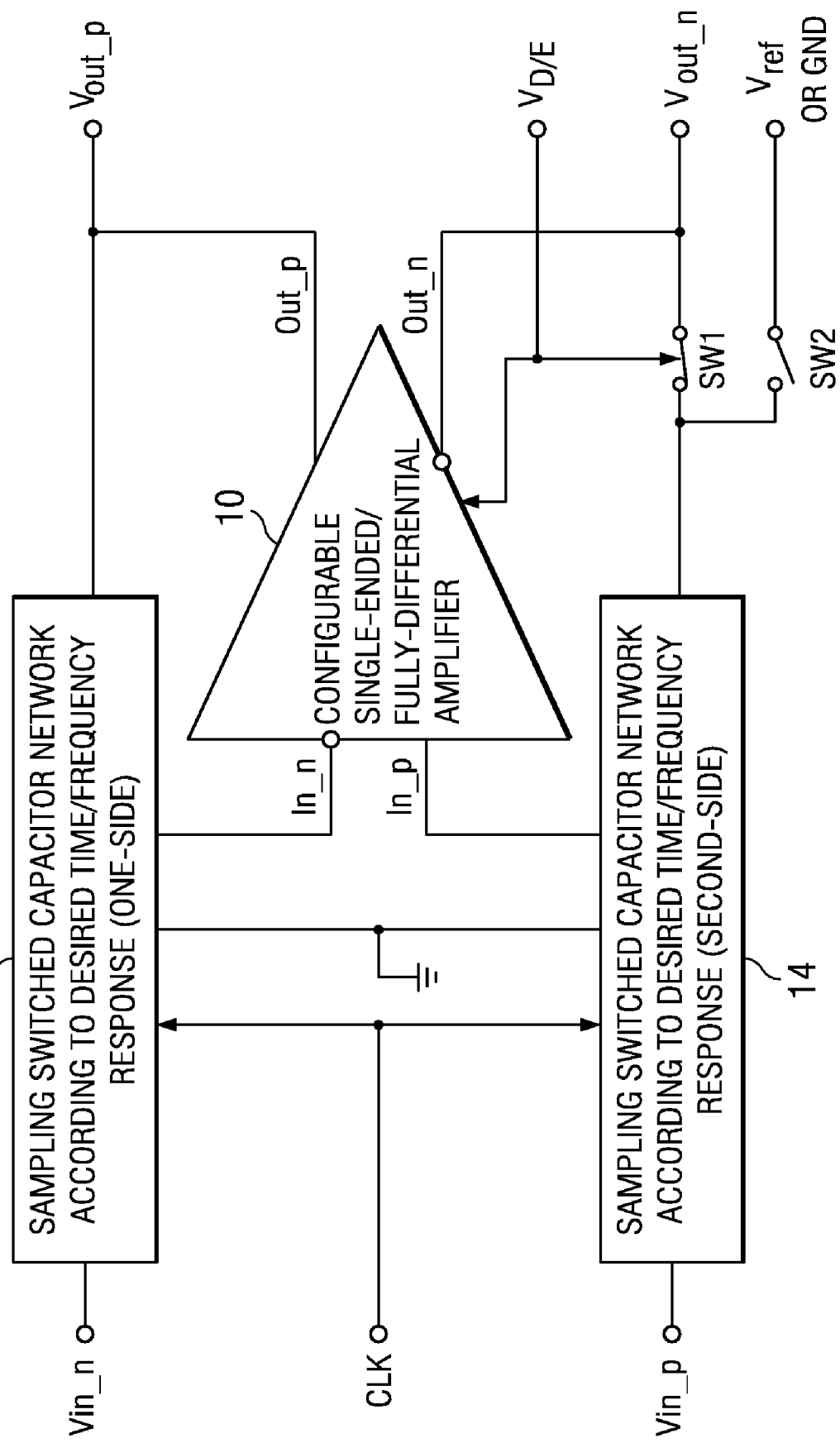
FIG. 1 is a schematic block diagram of an analog signal processing block that incorporates the invention.

With reference to FIG. 1, an analog signal processing block is implemented as an integrated circuit and comprises a differential amplifier 10 with differential inputs In_p and In_n and differential outputs Out_p and Out_n. A first switched capacitor network 12 has a signal input Vin_n, and input-sided terminal connected to the inverting input In_n of amplifier 10 and an output-sided terminal connected to the non-inverting output Out_p of amplifier 10. The processing block has a non-inverting signal output Vout_p connected to the output Out_p of amplifier 10. A second switched capacitor network 14 has a signal input Vin_p, an input-sided terminal connected to the non-inverting input In_p of amplifier 10 and an output-sided terminal shown in FIG. 1 as connected to the inverting output Out_n of amplifier 10 through a switch SW1. The processing block has an inverting signal output Vout_n connected to the output Out_n of amplifier 10.

As shown in FIG. 1, the analog signal processing block is configured to be fully differential, with a pair of complementary signal inputs Vin_p, Vin_n and a pair of complementary signal outputs Vout_p, Vout_n. Each of the switched capacitor networks 12, 14 has a clock input connected to a common sampling clock terminal CLK and a ground input connected to a common ground terminal GND. The sampled switched capacitor networks 12, 14 determine the frequency and time response characteristics of the analog signal processing block. The basic arrangement of the capacitors and switches in these networks may, for example, be similar to the arrangement disclosed in K. Martin, G. Temes et al., "A Differential Switch-Capacitor Amplifier," JSSC February 1987, at page 104.

To change the analog signal processing block from the fully differential mode shown in FIG. 1 to a single-ended mode, the switch SW1 is opened, the output-sided terminal of network 14 is connected to a reference potential or to ground through a switch SW2, and the differential amplifier 10 is configured to a single-ended output mode where its output Out_n is floating and only output Out_p is effective. A configuration control input $V_{D/E}$ receives a digital configuration control signal that controls switches SW1 and SW2 and is also applied to differential amplifier 10.

Figure 2:
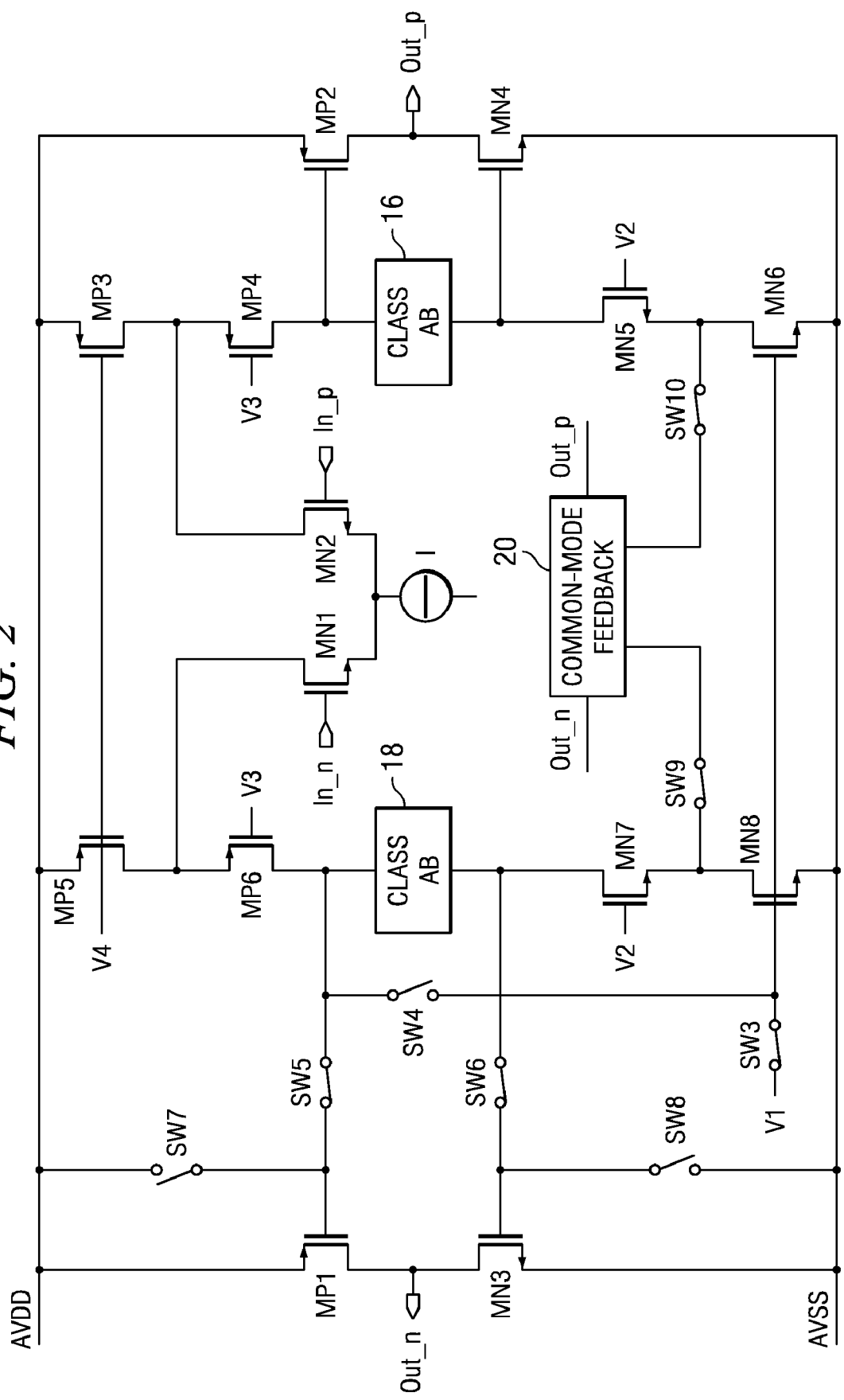
FIG. 2 is a simplified circuit diagram of a configurable differential amplifier used in the analog signal processing block of FIG. 1, and shown in a fully differential output configuration.

In FIG. 2, the differential amplifier 10 of FIG. 1 is shown configured in a differential output mode. Basically, the differential amplifier in the embodiment shown is fully symmetrical with an n-channel input transistor pair MN1, MN2 and two output stages. Input transistors MN1 and MN2 each have a source connected to a current source 1 and a drain connected to a folded cascode structure, described below. The gate of transistor MN1 is connected to receive the input In_n and the gate of transistor MN2 is connected to receive the input IN_p. On the inverting output side, the output stage has a p-channel transistor MP1 connected in series with an n-channel transistor MN3 between supply terminals AVDD and AVSS. The interconnected drains of transistors MP 1 and MN3 constitute the inverting output Out_n of the differential amplifier. Likewise, on the non-inverting output side, the output stage has a p-channel transistor MP2 connected in series with an n-channel transistor MN4 between supply terminals AVDD and AVSS. The interconnected drains of transistors MP2 and MN4 constitute the non-inverting output Out_p of the differential amplifier.

On the non-inverting output side, the gates of the transistors MP2, MN4 in the output stage are driven by a folded cascode structure that includes a series connection between supply terminals AVDD and AVSS of p-channel transistors MP3, MP4, a Class AB control block 16 and n-channel transistors MN5, MN6. The drain of input transistor MN2 is connected to the interconnected drain and source of transistors MP3 and MP4, as shown.

On the inverting output side, the gates of the transistors MP1, MN3 in the output stage are driven by a folded cascode structure that includes a series connection between supply terminals AVDD and AVSS of p-channel transistors MP5, MP6, a Class AB control block 18 and n-channel transistors MN7, MN8. The drain of input transistor MN1 is connected to the interconnected drain and source of transistors MP5 and MP6, as shown.

Common mode feedback circuitry 20 is connected in the differential output mode to both differential outputs Out_p and Out_n and to the interconnected nodes of transistors MN7 and MN8 on the negative output side and transistors MN5, MN6 on the positive output side.

While appropriate bias voltages V2, V3 and V4 are permanently applied to the gates of transistors MN7, MN5, to transistors MP6, MP4 and to transistors MP5, MP3, respectively, a bias voltage V1 is applied to the gates of transistors MN8 and MN6 only in the differential output mode through a closed switch SW3.

Figure 3:
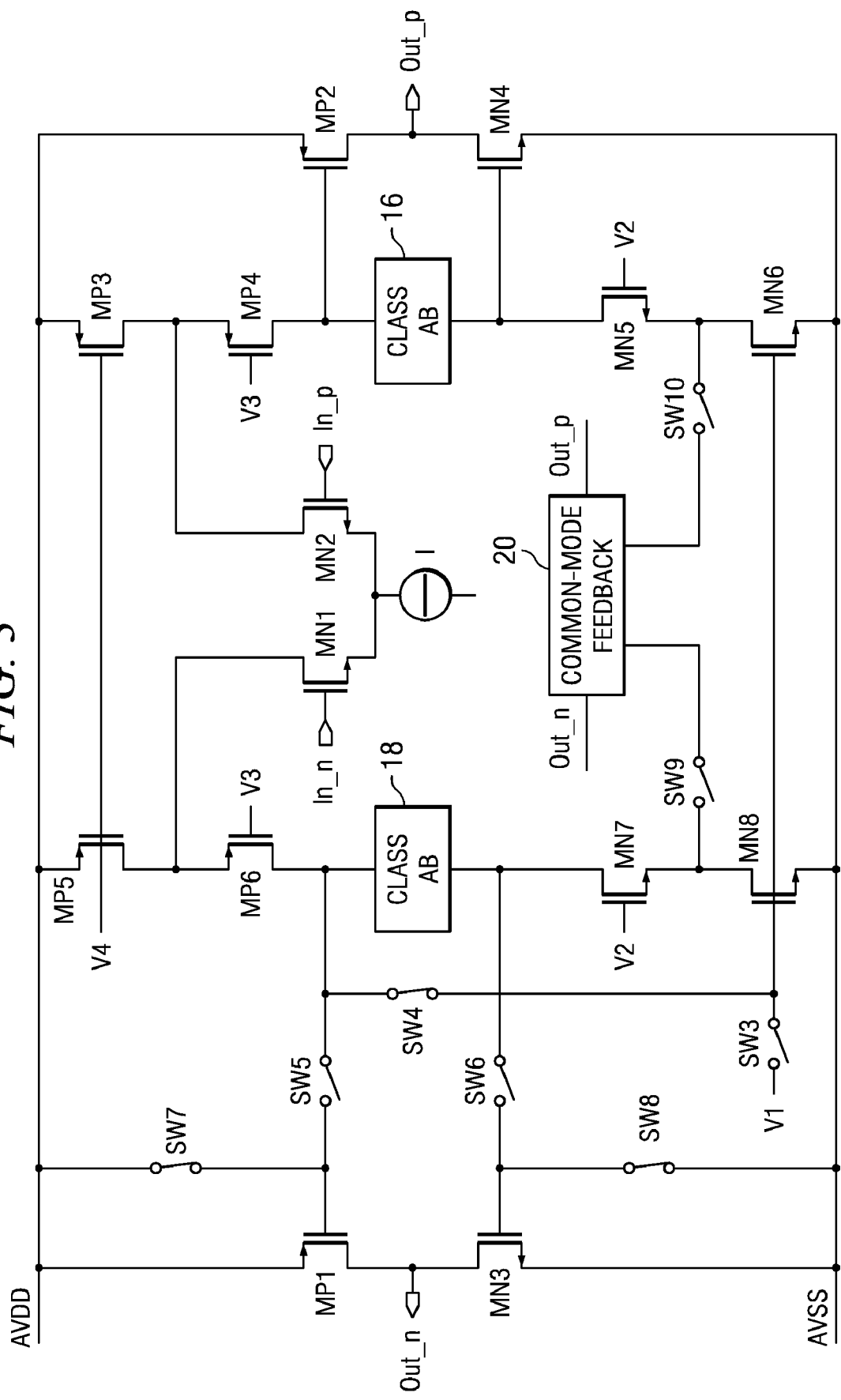
FIG. 3 is a simplified circuit diagram of the same configurable differential amplifier shown in a single-ended output configuration.

In the single-ended output mode shown in FIG. 3, switch SW3 is opened and a switch SW4 is closed to connect the gate of transistors, MN6, MN8 with the drain of transistor MP6, effectively shorting the class AB control block 18. At the same time, the gates of output transistors MP 1 and MN3 are disconnected from the folded cascode structure by opening switches SW5, SW6 and connected with their sources by closing switches SW7, SW8, so that the output Out_n is floating. In addition, the common mode feedback circuitry is disconnected by opening switches SW9, SW10.

All of the configuration switches SW1 to SW10 are controlled by the digital configuration control signal $V_{D/E}$.

What is claimed is:

1. An analog signal processing circuit block with differential signal inputs and including a differential amplifier with differential inputs and configurable to operate either in a differential output mode or in a single-ended output mode;
   the analog signal processing circuit block further including a pair of switched capacitor networks each connected to one of said differential signal inputs, an input-sided terminal connected to one of the differential inputs of the differential amplifier, and an output-sided terminal;
   wherein the output-sided terminal of a first one of said switched capacitor networks is connected to an output of the differential amplifier; and the output-sided terminal of a second one of said switched capacitor networks is connected to a complementary output of the differential amplifier when configured to operate in the differential output mode, and to a reference potential when configured to operate in the single-ended output mode.

2. The analog signal processing circuit block according to claim 1, wherein the differential amplifier has two output stages, and one of said output stages is disabled in the single-ended output mode.

3. The analog signal processing circuit block according to claim 2, wherein the differential amplifier includes an input pair of transistors that have their drains connected to a folded cascode structure with a class AB control block included in each branch of the folded cascode structure, and the class AB control block on the side of the output stage disabled in the single-ended output mode is also disabled in the single-ended output mode.

4. The analog signal processing circuit block according to claim 2, wherein said output stages each have complementary MOSFET driver transistors and said one output stage is disabled by disconnecting the gates of said driver transistors.

5. The analog signal processing circuit block according to claim 4, wherein the differential amplifier includes an input pair of transistors that have their drains connected to a folded cascode structure with a class AB control block included in each branch of the folded cascode structure, and the class AB control block on the side of the output stage disabled in the single-ended output mode is also disabled in the single-ended output mode.

6. The analog signal processing block according to claim 1, wherein the differential amplifier includes common mode feedback circuitry connected in the differential output mode and disconnected in the single-ended output mode.

7. The analog signal processing block according to any of claim 1, wherein the differential amplifier is configured by application, to the analog signal processing block, of a digital control signal that controls a set of configuration switches associated with the differential amplifier.

* * * * *